United States Patent [19]
Terakado et al.

[11] Patent Number: 5,540,820
[45] Date of Patent: Jul. 30, 1996

[54] THIN FILM FORMING METHOD

[75] Inventors: Masatomo Terakado; Shinji Sasaki, both of Yokohama; Hiroshi Saito, Fujisawa, all of Japan

[73] Assignee: Hitachi, Ltd., Tokyo, Japan

[21] Appl. No.: 76,691

[22] Filed: Jun. 15, 1993

Related U.S. Application Data

[63] Continuation of Ser. No. 799,146, Nov. 27, 1991, abandoned.

[30] Foreign Application Priority Data

Nov. 30, 1990 [JP] Japan ..................................... 2-329440

[51] Int. Cl.$^6$ ........................................................ C23C 14/34
[52] U.S. Cl. ............................... 204/192.3; 204/192.15; 204/192.17
[58] Field of Search ........................ 204/192.15, 192.17, 204/192.3

[56] References Cited

U.S. PATENT DOCUMENTS

| | | | |
|---|---|---|---|
| 3,437,888 | 4/1969 | Hall | 204/192.17 X |
| 3,515,663 | 6/1970 | Bodway | 204/192.17 X |
| 4,468,437 | 8/1984 | Patten et al. | 204/192.3 X |
| 4,710,398 | 12/1987 | Homma et al. | 204/192.17 X |
| 4,756,810 | 7/1988 | Lamont, Jr. et al. | 204/192.3 |
| 4,785,962 | 11/1988 | Toshima | 204/298.25 X |
| 4,816,126 | 3/1989 | Kamoshida et al. | 204/192.3 |
| 4,851,101 | 7/1989 | Hutchinson | 204/298.25 X |

FOREIGN PATENT DOCUMENTS

| | | |
|---|---|---|
| 55-31619 | 8/1980 | Japan. |
| 60-206045 | 10/1985 | Japan. |

OTHER PUBLICATIONS

Journal of Applied Physics, vol. 16, #1, "Thin Films Deposited by Bias Sputtering"—Maissel and Schaible.

Applied Surface Science 38 (1989) 295–303 "Stresses in Sputtered Tungsten Thin Films", CNRS, Laboratoire de Microstructure et de Microelectronique.

*Primary Examiner*—Nam Nguyen
*Attorney, Agent, or Firm*—Antonelli, Terry, Stout & Kraus

[57] ABSTRACT

A method of forming a thin film by a bias sputtering method using a first target made of a refractory metal mainly composed of W and a second target made of a conductive material mainly composed of a low-melting-point metal which comprises, upon sputtering the first target made of the refractory metal mainly composed of W, decreasing high energy particles incident to a substrate in a state where a desired bias voltage is applied to a substrate thereby forming a thin film of the refractory metal mainly composed of W with low resistivity and less stress and, subsequently, upon sputtering the second target made of the conductive material mainly composed of the low-melting-point metal, accelerating the growth of crystals in a state where a desired voltage is applied to a substrate thereby forming in lamination a thin film of the conductive material mainly composed of the low-melting-point metal with a large crystal grain size on the thin film made of the refractory metal mainly composed of W.

9 Claims, 8 Drawing Sheets

THIN FILM FORMING METHOD

This application is a continuation of application Ser. No. 07/799,146, filed on Nov. 27, 1991 now abandoned.

BACKGROUND OF THE INVENTION

The present invention concerns a method of forming a thin film and a thin film device and it, particularly, relates to a method of forming a thin film which is suitable to the sputtering formation of a wiring layer in a semiconductor device.

For instance for the formation of the thin film of a refractory metal, sputtering of tantalum (hereinafter referred to as Ta) has been introduce in, Journal of Applied Physics, 36 (1965), pages 237–242, and it is disclosed that bias sputtering is effective for reducing the resistance value of the film. Further, sputtering for tungsten (hereinafter referred to as W), has been shown in Applied Surface Science, 38 (1989), pp 295–303 and it is reported that stresses in the film can be suppressed by forming the film under the application of a negative bias voltage and low target power. On the other hand, it is considered that life of the wiring film of the semiconductor device depends on the disconnection of wiring caused by a phenomenon that atoms migrate by the flow of an electric current in the wiring (electromigration) and a phenomenon that the atoms migrate caused by the stresses on the wiring (stressmigration). For the formation of the wiring film of the semiconductor device, it has heretofore been proposed in, for example, Japanese Patent Publication Sho 55-31619, a laminate wiring structure has been proposed with an aim of improving the wiring life and it is described that the structure can suppress the migration of atoms constituting the wiring and the improvement of the wiring life can be realized. Further, it is disclosed in Japanese Patent Laid-Open Sho 60-206045 that electromigration tolerance can be improved by controlling the grain size of the wiring film, which contributes to the improvement of the wiring life. However, although it has been disclosed that the bias sputtering for Ta is effective for reducing the resistance value of the film in the Journal of Applied Physics, 36 (1965), pp 237–242, the stresses in the film are increased by mere application of the bias voltage and it is difficult to obtain a thin film with a less stress and low resistance.

Further, it has been disclosed that if the film is formed with a decreased target electric power, the film stress can be suppressed in the bias sputtering for W, in Applied Surface Science, 38 (1989), pp 295–303, but if the target electric power is decreased, it results in a problem of lowering the deposition rate, as well as it is also difficult to obtain a thin film with less stress and low resistance by the mere application of the bias voltage as described above.

Further, it is described that a wiring having an electromigration tolerance can be provided by using a laminate wiring of a compound layer of aluminum (hereinafter referred to as Al) and a transition metal and Al in Japanese Patent Publication Sho 55-31619 and it is stated that the grain size of Al has to be refined in order to rapidly form the compound layer of Al and the transition metal. However, it has been considered at present that the electromigration tolerance is low if the crystal grain size is fine and it is difficult to obtain a practical reliability in a so-called submicron wiring with the width of a wiring of less than 1 μm by this method.

Further, in Japanese Patent Laid-Open Sho 60-206045, it is described that disconnection failure can be reduced for the wiring in a semiconductor device by controlling the crystal grain of an Al alloy constituting the wiring. However, in the so-called submicron wiring with a wiring of less than 1 μm width, it is difficult to obtain a practical reliability of the wiring by merely controlling the crystal grain size so long as the Al alloy is used in a single layer.

SUMMARY OF THE INVENTION

In view of the foregoing problems in the prior art, a first object of the present invention is to provide a sputtering method for forming a thin film made of a refractory material with low resistance and low stress.

Specifically, the present invention concerns a method of forming a thin film made of a refractory metal by a bias sputtering method using a target made of a refractory metal mainly composed of tungsten (hereinafter referred to as W), in which a thin film made of a refractory metal mainly composed of W with reduced resistivity and stress is formed by reducing high energy particles incident to a substrate in a state where a desired bias voltage is applied to the substrate.

For attaining the foregoing first object of the present invention, it is determined in the first means of the present invention, that a film-forming pressure P is greater than 3 Pa, a distance TS between a target and a substrate is greater than 60 mm and a substrate bias voltage V is between −75 V and −150 V, as well as values for P, TS and V are selected so as to satisfy the following relationship for P, TS and V:

$$1 \leq 1.3 \times 10^5 \cdot P \cdot TS/V^2 \leq 5 \ (Pa \cdot m \cdot V^{-2})$$

Under the conditions determined as described above, the incident amount, to the substrate, of so-called recoil atoms having a great kinetic energy which collide against the target under acceleration by a relatively strong electric field near the target and partially reflected from the surface of the target in a manner of elastic collision is decreased by enlarging the distance between the target and the substrate, as well as the impinging frequency with film-forming gas molecules is increased to lower the kinetic energy of the recoil atoms and high energy ions in plasmas by increasing the gas pressure during film formation.

As a result, the thin film formed on the substrate is less damaged by high energy particles and, further, since a relatively weak bias is applied to the substrate, the surface of the thin film growing on the substrate is collided with ions of a relatively low kinetic energy so that a film grows under promoted diffusion of atoms at the surface and, accordingly, the resistivity of the film is reduced and approaches to that of the value of a bulk and an extreme increase of the stress can also be suppressed.

Thus, a thin film of refractory metal with low resistivity and less stress can be obtained stably.

A second object of the present invention is to provide a method of forming a laminate wiring film comprising a thin film of a refractory metal and a thin film of low-melting-point metal stacked to each other for obtaining a wiring film of high reliability excellent in the electromigration and stressmigration tolerance in a semiconductor device.

Specifically, the present invention concerns a method of forming a thin film by a bias sputtering method using a first target made of a refractory metal mainly composed of W and a second target made of a conductive material mainly composed of a low-melting-point metal which comprises, upon sputtering the first target made of the refractory metal mainly composed of W, decreasing high energy particles incident to a substrate in a state where a desired bias voltage is applied to the substrate thereby forming a thin film of the refractory metal mainly composed of W with low resistivity and less stress and, subsequently, upon sputtering the second target made of the conductive material mainly composed of the low-melting-point metal, accelerating the crystal growth in a state where a desired voltage is applied to a substrate thereby forming in lamination a thin film of the conductive material mainly composed of the low-melting-point metal with a large crystal grain size on the thin film made of the refractory metal mainly composed of W.

For attaining the second object of the present invention, the second means according to the present invention comprises, in the formation of a first thin film made of a refractory metal mainly composed of W, setting first film-forming conditions with a film-forming pressure of greater than 3 Pa, a distance between the target and the substrate of greater than 60 mm and a substrate bias voltage of between −75 V to −150 V, thereby preventing high energy particles from being incident on the substrate while, in the formation of a second thin film made of a conductive material mainly composed of a low-melting-point metal, setting the substrate bias voltage to between −40 V and −100 V, thereby promoting the crystal growth in the second thin film, in which the substrate forming the first thin film is maintained in a high vacuum of less than $1.0 \times 10^{-4}$ Pa between the formation of the first thin film and the formation of the second thin film, thereby forming the second thin film while keeping the surface of the first thin film clean. Under the above-mentioned conditions, in the sputtering for the first target made of the refractory metal mainly composed of W, high energy particles incident to the substrate can be reduced in the same manner as in the case of forming the thin film made of the refractory metal by the first means of the present invention as described above, to stably obtain a thin film metal of the refractory metal with low resistivity and less stress in the same manner as in the case of forming the metal thin film made of the refractory metal by the first means of the present invention described above.

Then, by maintaining the substrate carrying the thin film of the refractory metal mainly composed of W in a high vacuum of less than $1.0 \times 10^{-4}$ Pa before starting the sputtering for the second target made of the conductive material mainly composed of the low-melting-point metal, sputtering for the second target of the conductive material mainly composed of the low-melting-point metal is conducted in a state keeping the surface clean for the thin film made of the refractory metal mainly composed of W with no formation of oxide layers. In the sputtering, by applying a relatively weak bias voltage to the substrate and colliding ions of a relatively weak energy against the surface of the substrate, thereby growing the thin film under promoted diffusion of atoms at the surface of the thin film to accelerate the growth of crystals, so that a thin film of the conductive material mainly composed of the low-melting-point metal with a relatively large crystal grain size is formed in lamination on the thin film of the refractory metal mainly composed of W.

In the wiring layer of such a laminate structure, the refractory metal film as the underlying layer contribute to the resistance against electromigration or stressmigration, while mainly the thin film of the conductive material in the upper layer and also the thin film of the low-melting-point metal in the underlying layer reduced with the resistance contribute to the resistance value.

This can provide a laminate wiring film with low resistance value, strong resistance against electromigration or stressmigration and having long wiring life.

BRIEF DESCRIPTION OF THE DRAWINGS

FIG. 3 is a graph illustrating an example of a relationship between a bias voltage and a film stress when a film of W is formed by sputtering, in which

FIG. 4 is a graph illustrating an example of a relationship between a bias voltage and resistivity when a film of W is formed by bias sputtering, in which

DESCRIPTION OF THE PREFERRED EMBODIMENTS

Description will be made to one embodiment of a first means in the present invention with reference to FIGS. 1 and 3 to 6.

Figure 1:
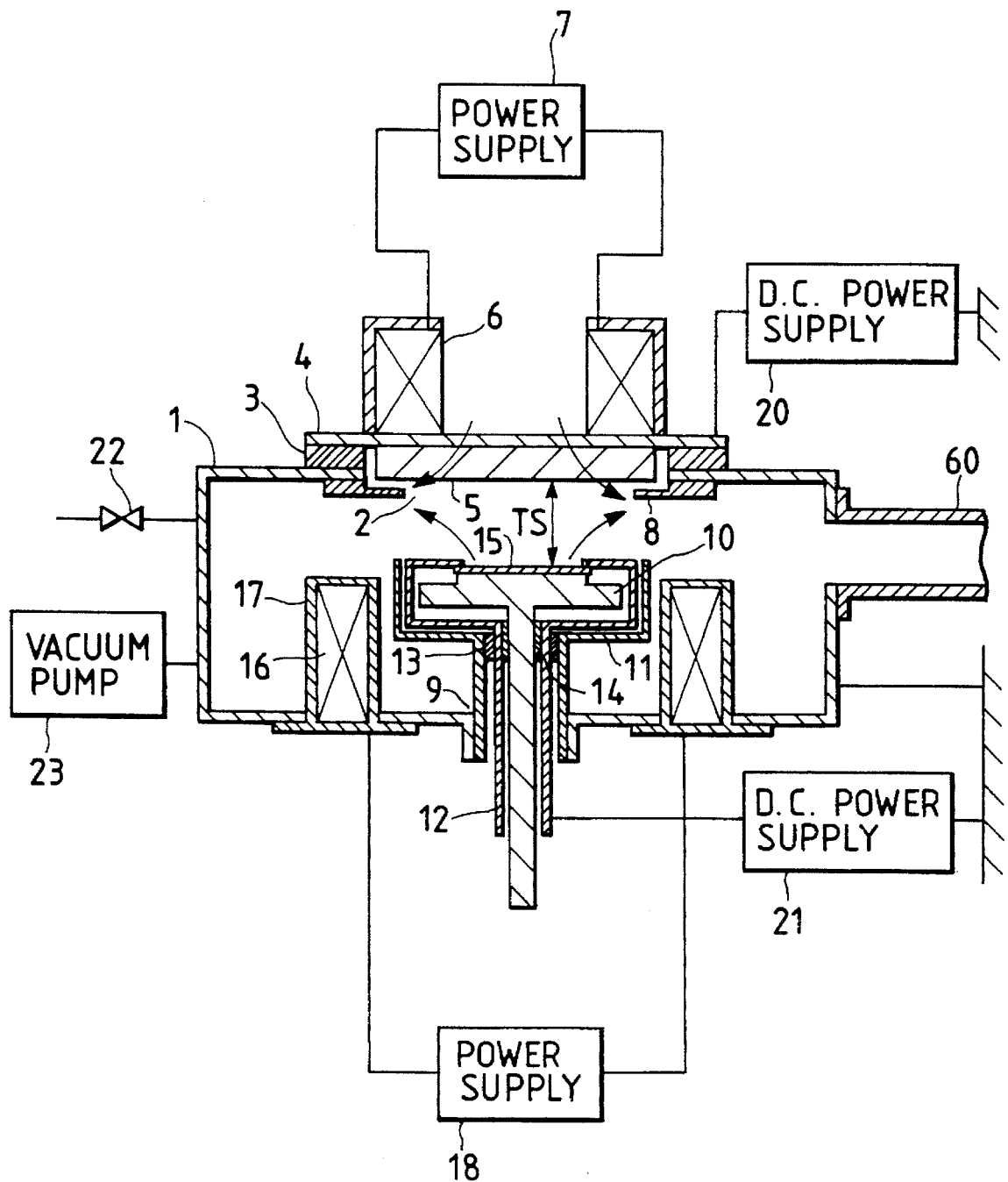
FIG. 1 is a vertical cross sectional view illustrating an embodiment of a first film-forming chamber in a thin film forming device for realizing the present invention.

FIG. 1 is a vertical cross sectional view illustrating one embodiment of a typical magnetron sputtering device for realizing the method of forming a thin film according to the present invention.

In FIG. 1, a vacuum container 1 has an opening 2 formed therein and a target 5 of a sputtering electrode 4 attached by way of an insulator 3 is faced to the inside of the vacuum container 1. There are also shown an electromagnet 6, a power source 7 for the electromagnet 6, an anode electrode 8, an opening 9 disposed to the vacuum vessel 1 for mounting a substrate electrode 10. A substrate chucking device 12 is supported by way of insulators 13 and 14 to an earth shield 11 and the substrate electrode 10. There are also shown a substrate 15, an electromagnet 16, a cover 17 for the electromagnet 16, a power source 18 for the electromagnet 16, a DC power source 20, an another DC power source 21, a gas introduction means 22 and an evacuation means 23.

With the constitution as described above, after evacuating the inside of the vacuum vessel 1 by the evacuating means 23 in a state of setting the substrate 15, a gas (for instance, argon gas: Ar) is introduced from the gas introduction means 22 to maintain the inside of the vacuum vessel 1 to a predetermined pressure. In this case, the electromagnets 6 and 16 are energized by the power sources 7 and 18. Then, an electric power is applied by the DC power source 20 to the sputtering electrode 4 to generate magnetron discharge near the surface of the target 5 to sputter the target 5. In this case, a magnetic field suitable to the magnetron discharge is formed near the surface of the target by means of the electromagnets 6 and 16.

Upon conducting the magnetron sputtering, an electric power is also applied by means of the DC power source 21 by way of the substrate chucking device 12 to the substrate 15 at the same time, to conduct so-called bias sputtering.

Figure 3A:
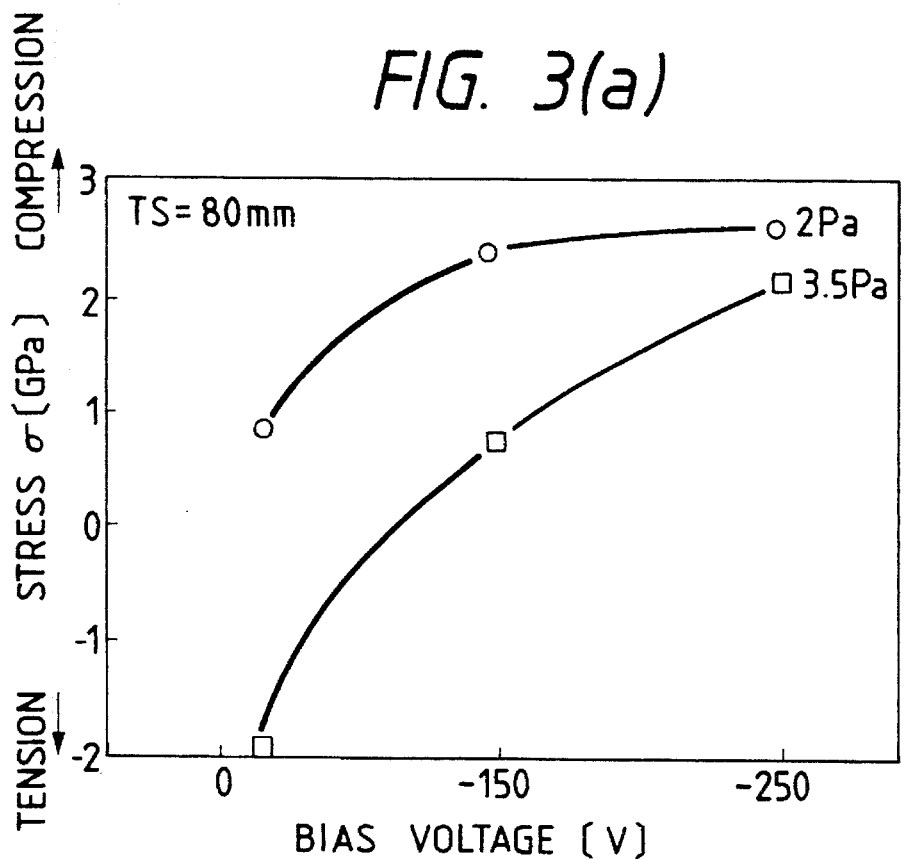
FIG. 3(a) shows a case where TS is 80 mm and FIG. 3(b) shows a case where TS is 40 mm.
Figure 3B:
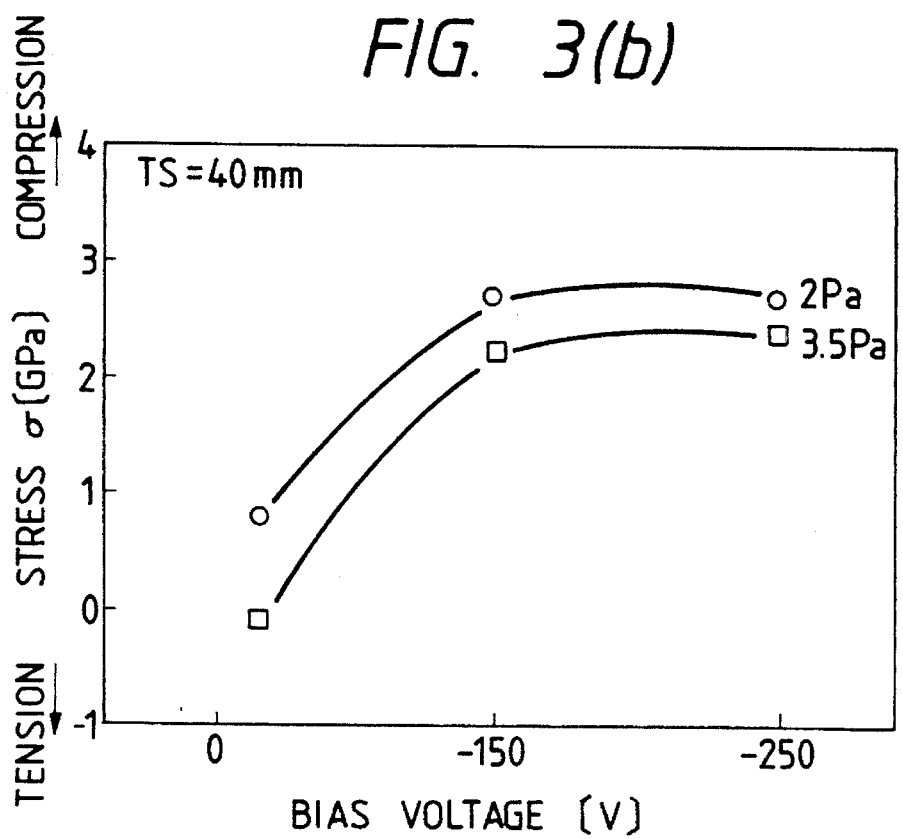

In a case of using the target made of tungsten (W) in such a film formation by bias sputtering, relationships for the distance TS between the target and the substrate, the film-forming pressure P and the stress in the film formed on the substrate 15 are as shown in FIG. 3. FIG. 3(a) represents a case where TS is 80 mm, while FIG. 3(b) shows a case where TS is 40 mm. As can be seen from the figure, the range for the bias application condition of reducing a tensile or compressive stress of the film to less than 1 GPa is extended by widening TS or increasing P. That is, by setting TS to 80 mm and P to 3.5 Pa, the setting range of the bias voltage V for reducing the tensile or compressive stress of the film to less than 1 GPa can be made extended considerably as about from −75 V to −150 V. If the values for TS and P are made greater respectively, the setting range for V described above is further extended.

Figure 4A:
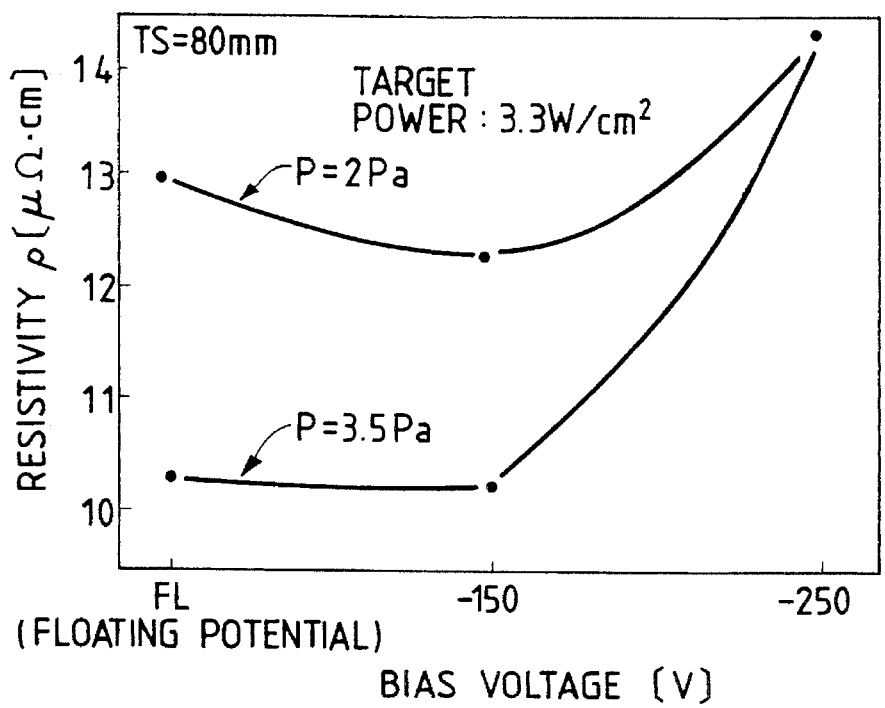
FIG. 4(a) shows a case where TS is 80 mm.
Figure 4B:
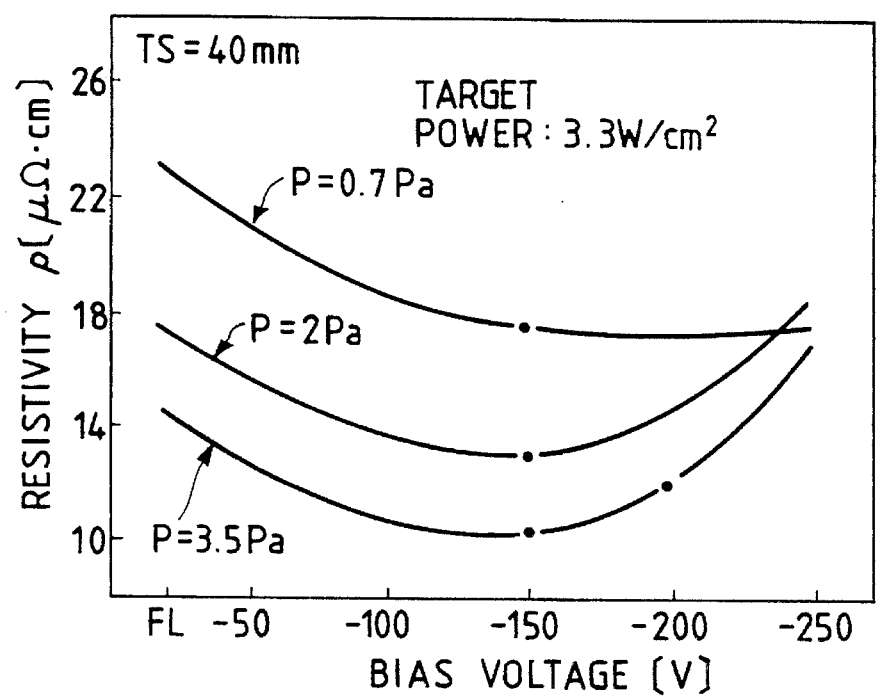
FIG. 4(b) shows a case where TS is 40 mm.

Next, a relationship between the film-forming pressure P and the resistivity of the film formed on the substrate 15 is as shown in FIG. 4. In FIG. 4, FIG. 4(a) shows a case where TS is 80 mm, while FIG. 4(b) shows a case where TS is 40 mm. As can be seen from the figure, the resistivity of the thin film is reduced by widening TS or by increasing P. Further, when TS is 80 mm, the resistivity scarcely changes by the bias voltage from the floating potential to −150 V. That is, when TS is set to 80 mm and P is set to 3.5 Pa, a thin film with the resistivity of about 10 μΩ·cm is obtained. When TS and P are further increased, a thin film of lower resistivity can be obtained.

From the experimental data described above, a relationship is established for the film-forming pressure P, the distance TS between the target and the substrate, and the bias voltage V: as $$1 \leq 1.3 \times 10^5 \cdot P \cdot TS/V^2 \leq 5 \ (Pa \cdot m \cdot V^{-2})$$

That is, when each of the values for P, TS and V is set so as to establish the relation of the equation mentioned above among them, a thin film of less stress and low resistivity can be obtained.

As has been described above, by enlarging the distance TS between the target and the substrate and increasing the film-forming pressure P, a colliding frequency is increased between so-called recoil atoms having a large kinetic energy colliding against the target under acceleration with a relatively strong electric field near the target and partially reflected from the surface of the target in a manner of elastic collision, and charged particles accelerated by a relatively strong electric field in and at the periphery of plasmas, and film-forming gas molecules, by which the kinetic energy of the so-called high energy particles such as the recoil atoms and the charged particles as described above and high energy particles incident to the substrate during film formation are decreased.

As a result, the film formed on the substrate less suffers from damages by the high energy particles. Further, since the surface of the thin film growing on the substrate is collided by ions of a relatively small kinetic energy and the film is grown under diffusion of the atoms on the surface by applying a relatively weak bias on the substrate, the resistivity of the film is reduced and approaches to that of the value of a bulk, and an extreme increase of the stress can also be suppressed.

This enables to stably obtain a thin film of a refractory metal with low resistivity and less stress.

The above-mentioned embodiment shows a case of using the DC power sources 20 and 21, but one or both of the DC power sources 20 and 21 can be replaced with a radio frequency power source or a pulse power source.

Figure 5:
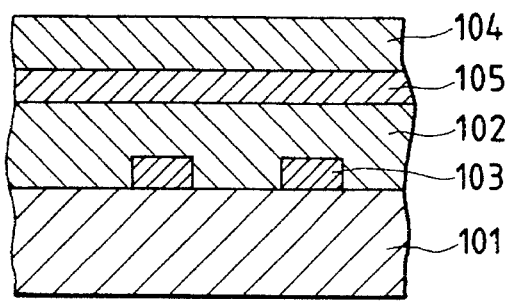
FIG. 5 is a cross sectional view illustrating an embodiment of a semiconductor device using a thin W film formed according to the present invention.

FIG. 5 is a cross sectional view illustrating one embodiment of a semiconductor device having a thin film of a refractory metal formed by the above-mentioned method. In the drawing, are shown a substrate 101, a first insulation film 102, a wiring film 103 at the first level, a second insulation film 104 and a wiring film 105 at the second level.

Figure 6:
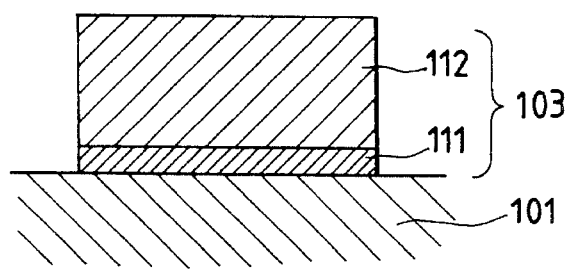
FIG. 6 is an enlarged view for a portion 103 shown in FIG. 5.

FIG. 6 is an enlarged view for the cross section of the first level 103 and the second level wiring 105. 111 shows an underlying film of the wiring. When a thin film of the refractory metal with low resistivity and less stress is used as the underlying film for the wiring, reliability for the wiring film 112 can be ensured.

Although descriptions have been made to the laminate wiring structure in the embodiment for the semiconductor device, a single layer structure only comprising the thin film 111 made of a refractory metal with no wiring film 112 may also be used.

As has been described above by the first means according to the present application, there is an advantageous effect that a thin film made of the refractory metal of good quality with low resistivity and less stress can be obtained stably.

Further, when the thin film made of the refractory metal by the first means according to the present invention is used for the semiconductor device, there is also an advantageous effect that a wiring film of high reliability can be obtained.

Description will now be made to one embodiment for the method forming a laminate film by the second means according to the present invention with reference to FIGS. 1 and 2 and FIGS. 7 through 13.

Figure 2:
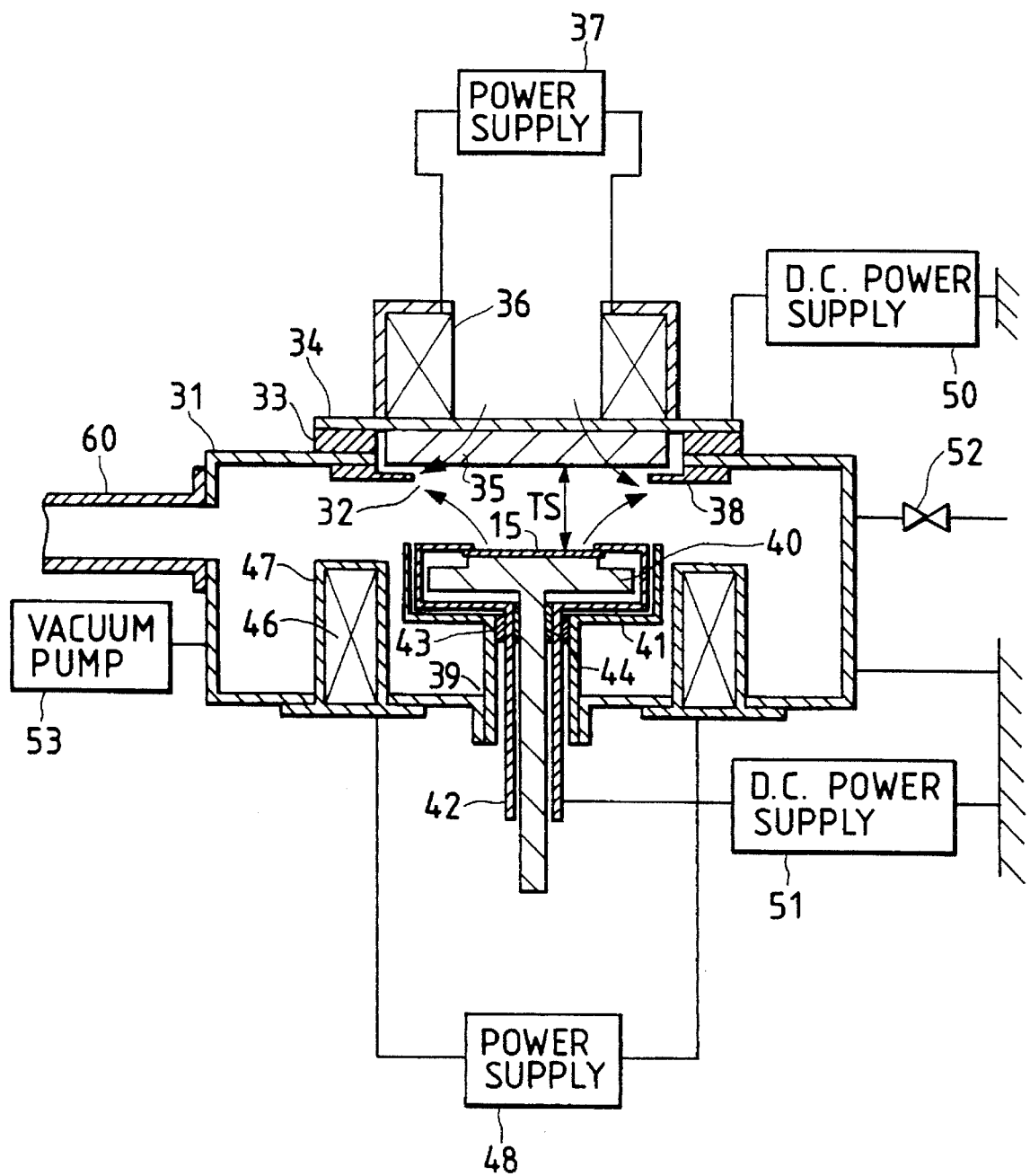
FIG. 2 is a vertical cross sectional view illustrating one embodiment of a second film-forming chamber in a thin film forming device for realizing the present invention.

The constitution shown in FIG. 1 is as has been described for the embodiment of the first means according to the present invention. In FIG. 2, an opening 32 is disposed to a vacuum vessel 31, and a target 35 of a sputtering electrode 34 attached by way of an insulator 33 is faced to the inside of the vacuum vessel 31. There are disposed an electromagnet 36, a power source 37 for the electromagnet 36, an anode electrode 38, an opening 39 disposed to the vacuum vessel 31, to which a substrate electrode 40 is attached, an earth shield 41, a substrate chucking device 42 which is supported by way of insulators 43 and 44 to the earth shield 41 and the substrate electrode 40. There are also provided a substrate 15, an electromagnet 46, a cover 47 for the electromagnet 46, a power source 48 for the electromagnet 46, a DC power source 50, an another DC power source 51, a gas introduction means 52 and an evacuating means 53.

A vacuum vessel 60 connects the vacuum vessel 1 shown in FIG. 1 and the vacuum vessel 31 shown in FIG. 2.

Description will be made to a process for forming a thin laminate film by the constitution described above. At first, the process for forming the thin film of refractory metal at the first layer in the vacuum vessel 1 is the same as described with respect to one embodiment of the first means according to the present invention described above.

Description will then be made to the formation of the conductive thin film at the second layer with reference to FIG. 2.

The substrate 15 on which a thin film made of a refractory metal is transported by way of a transportation means (not illustrated) passing through the vacuum vessel 60 to the vacuum vessel 31 and placed on the substrate electrode 40 and retained by the substrate chucking device 42. When the substrate 15 is transported, the inside of the vacuum vessels 1, 31 and 60 is maintained at a pressure lower than $1.0 \times 10^{-4}$ Pa, so that oxide layers are not grown on the surface of the substrate during transportation. After highly evacuating the inside of the vacuum vessel 31 in this state by the evacuating means 53, a gas (for example, argon gas: Ar) is introduced by the gas introduction means 52 to maintain the inside of the vacuum vessel 31 to a predetermined pressure. Then, the electromagnets 36 and 46 are energized by the power sources 37 and 48, respectively. Then, an electric power is applied by the DC power source 50 to the sputtering electrode 34 to generate magnetron discharge near the surface of the target 35, thereby sputtering the target 35. In this state, a magnetic field suitable to the magnetron discharge is formed near the surface of the target by the electromagnets 36 and 46.

When the film-formation is conducted by the magnetron sputtering, an electric power is also applied to the substrate 15 by the DC power source 51 by way of the substrate chucking device 42 to conduct so-called bias sputtering film formation, and form a thin film made of the conductive material composed of low-melting-point material on the substrate 15.

In the formation of a laminate film made of the refractory metal and the low-melting-point metal, description will be made to a case in which the target 5 comprises an alloy of Ti and W as the material of the refractory metal and the target 35 comprises an alloy of Al, Cu and Si as the conductive material composed of a low-melting-point metal.

Figure 7:
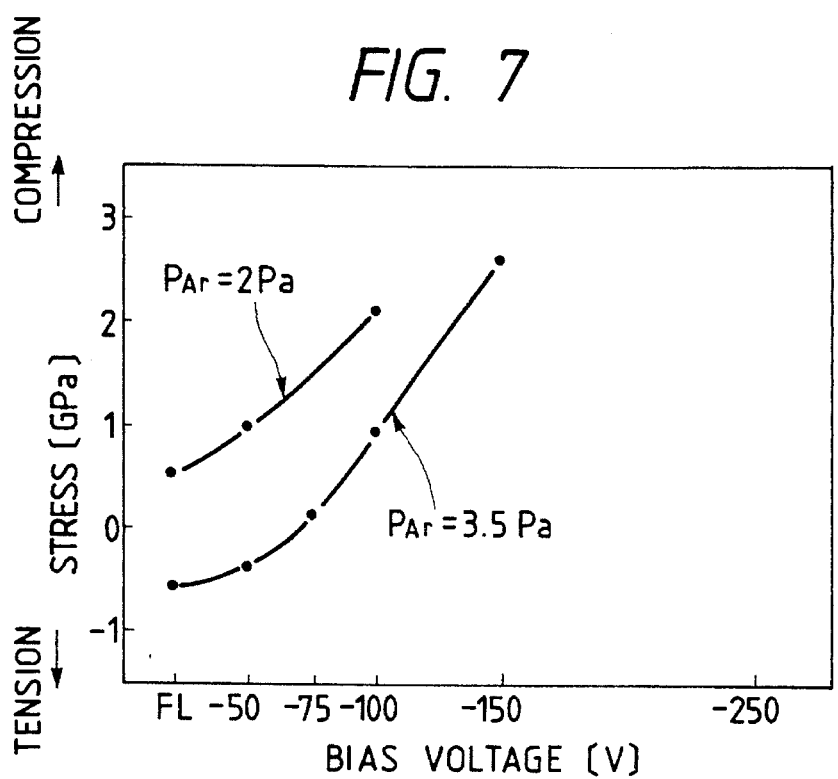
FIG. 7 is a graph illustrating an example of a relationship between a substrate bias voltage and a film stress when an alloy target of W and Ti (10 wt %) is formed by sputtering.

In the bias sputtering film formation described above, a relationship between the substrate bias voltage and the stress of the film formed on the substrate 15 using the film-forming pressure P as a parameter, in a case of using a target 5 comprising an alloy of W and Ti (10 wt %) forming a thin film made of the refractory metal at the first layer is as shown in FIG. 7. As can be seen from the figure, the range for the bias application condition for reducing the tensile or compressive stress of the film to less than 1 GPa is extended as the pressure P is higher. That is, if P is set to 3.5 Pa, the setting range of the bias voltage V for reducing the tensile or compressive stress of the film to less than 1 GPa can be extended relatively widely as between the state of insulating the substrate from the ground, that is, the floating potential (about –30 V) to –100 V. In a case of setting the P to 3.5 Pa. If the value for the P is further increased, the setting range for the V is further extended. In this case, the distance TS between the target and the substrate is 60 mm.

Figure 8:
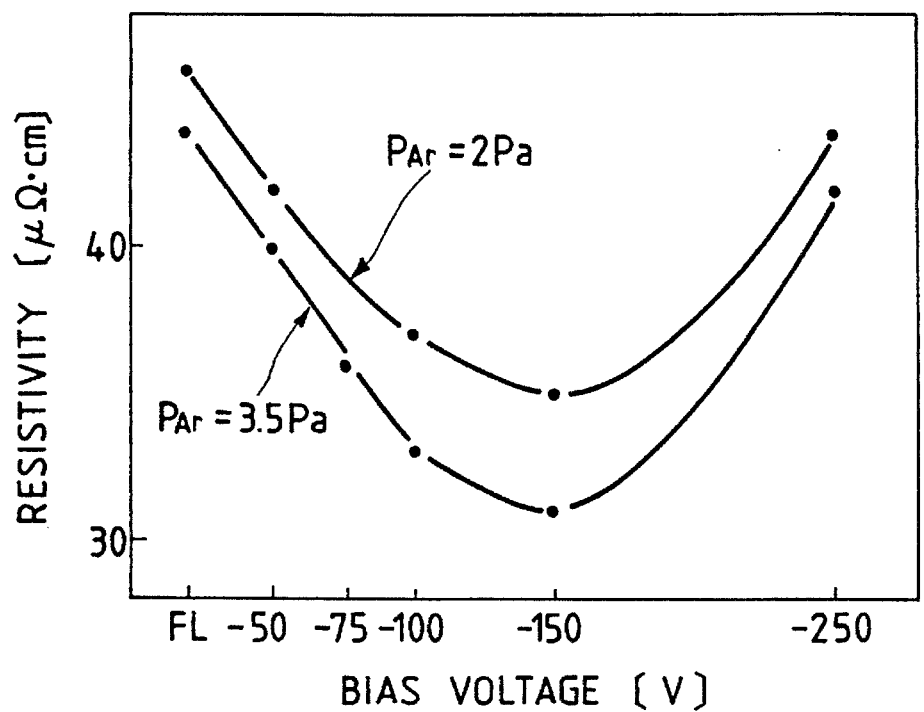
FIG. 8 is a graph illustrating an example of a relationship between a substrate bias voltage and a film resistivity when an alloy target of W and Ti (10 wt %) is formed by sputtering.

Then, a relationship between the substrate bias voltage and the resistivity of the film formed on the substrate 15 by using the film-forming pressure P as a parameter is as shown in FIG. 8. As can be seen from the figure, the resistivity of the thin film is lower as P is higher and, if P is 2 Pa and 3.5 Pa, the resistivity is minimized when the bias voltage V is –150 V for both of the cases. That is, as compared with the case when the bias voltage V is at the floating voltage (FL), the effect of applying the bias voltage appears to decrease the resistivity monotonously at the range of the bias voltage V from FL to –150 V. On the other hand, if V exceeds –150 V, the film is damaged to increase the resistivity. From the result of the experiment, the effect of applying the bias voltage is distinctly shown already at –50 V.

As has been described above, in the bias sputtering using a target made of the refractory metal comprising the alloy of W and Ti (10 wt %), a thin film made of the refractory metal of less film stress and low resistivity can be obtained by setting the film-forming pressure P to higher than 3 Pa, the distance TS between the target and the substrate to greater than 60 mm and the substrate bias voltage between –40 V and –100 V.

That is, by increasing the film-forming pressure P, a colliding frequency is increased between so-called recoil atoms having a large kinetic energy colliding against the target under acceleration with a relatively strong electric field near the target and partially reflected from the surface of the target in a manner of elastic collision, and charged particles accelerated by a relatively strong electric field in and at the periphery of plasmas, and film-forming gas molecules, by which the kinetic energy of the so-called high energy particles such as the recoil atoms and the charged particles as described above and high energy particles incident to the substrate during film formation are decreased.

As a result, the film formed on the substrate less suffers from damages by the high energy particles. Further, since the surface of the thin film growing on the substrate is collided by ions of a relatively small kinetic energy and the film is grown under diffusion of the atoms on the surface by applying a relatively weak bias on the substrate, the resistivity of the film is reduced and approaches to that of the value of a bulk, and an extreme increase of the stress can also be suppressed.

This enables to stably obtain a thin film of a refractory metal with low resistivity and less stress.

Figure 9:
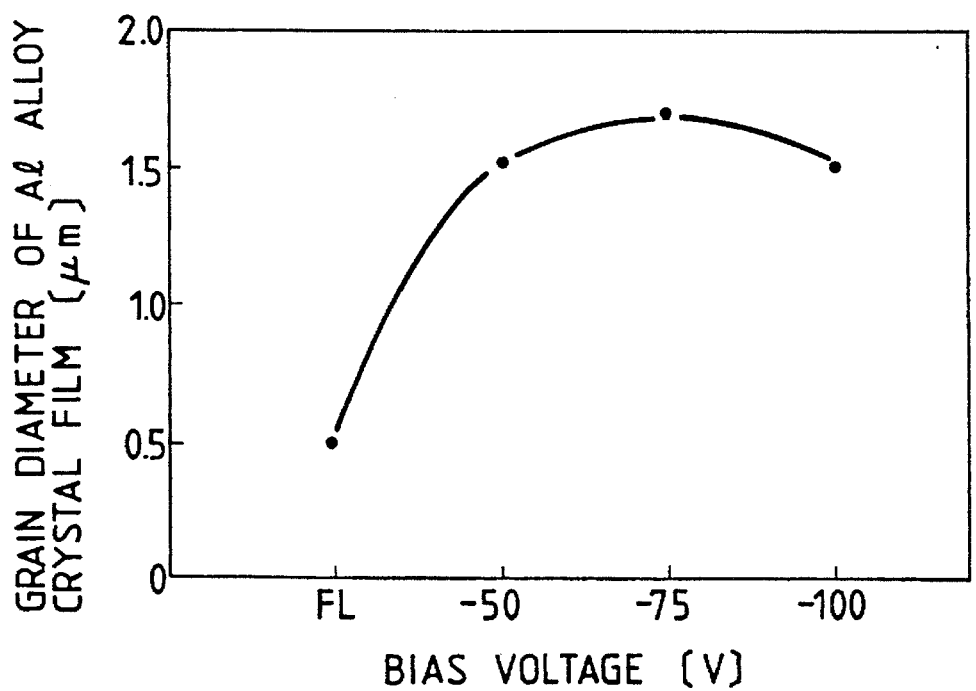
FIG. 9 is a graph illustrating an example of a relationship between a substrate bias voltage and a crystal grain size of an Al alloy film.
Figure 10:
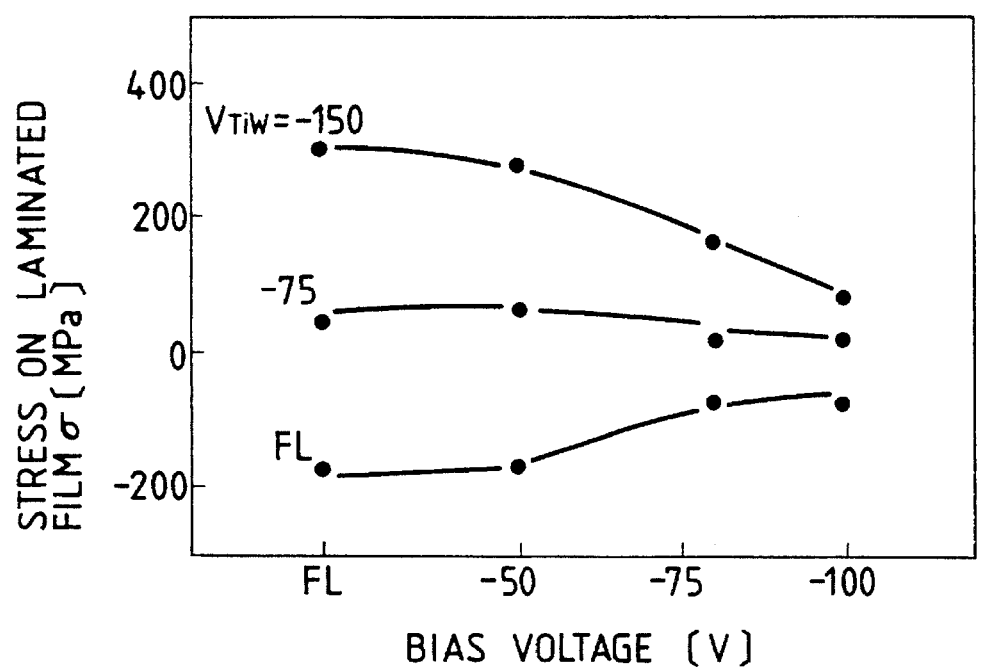
FIG. 10 is a graph illustrating a relationship between a substrate bias voltage and a film stress in a laminate wiring film upon forming an Al alloy film.

Then, a relationship between the bias voltage and the crystal grain size of the Al alloy film when a target comprising an alloy of Al, Cu (0.5 wt %) and Si (1.5 wt %) forming a conductive thin film at the second layer (hereinafter referred to as Al alloy) is sputtered is as shown in FIG. 9.

That is, the crystal grain size of the Al alloy film at the floating potential where no bias voltage is applied to the substrate is about 0.5 µm, whereas a crystal grain size of greater than 1.5 µm which is three times as greater as the former is obtained when a bias sputtering film formation is conducted by setting the bias voltage in a range from –50 V to –100 V, and the crystals grow to the grain size of twice or greater about at –40 V. In particular, when the bias voltage is at –75 V, the crystals grow to a grain size of three times or greater, i.e., about 1.7 µm.

On the other hand, it has been known that the Al alloy film is damaged if the bias voltage is increased to greater than –100 V.

Accordingly, an Al alloy film having a crystal grain size which is greater by more than twice as compared with a case at the floating potential and with no damages can be formed by setting the bias voltage between –40 V and –100 V.

Figure 11:
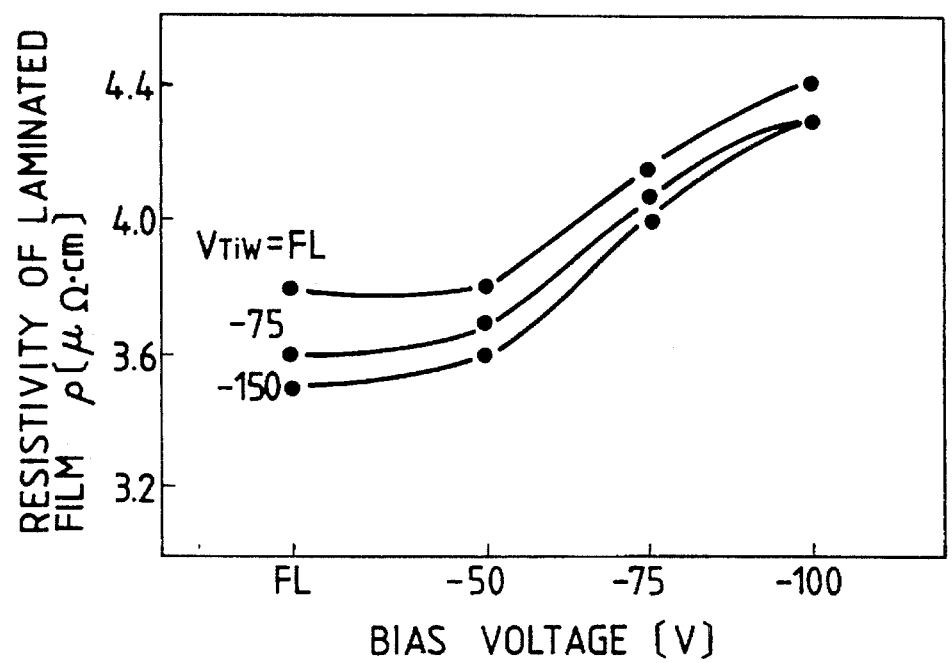
FIG. 11 is a graph illustrating a relationship between a substrate bias voltage and a resistivity of a laminate wiring film upon forming an Al alloy film.

For the laminate wiring film of a two layer structure formed under the conditions as described above, FIG. 10 shows a relationship between the substrate bias voltage and the film stress and FIG. 11 shows a relationship between the substrate bias voltage and the resistivity upon forming the Al alloy film.

When the thin film for each of the layers is formed in a range for each of the conditions, the stress and the resistivity of the laminate film can be reduced sufficiently and a sufficiently large crystal grain size can be obtained for the Al alloy film as described above.

The above-mentioned embodiment shows a case of using the DC power sources 20 and 21 and the DC power sources 50 and 51 but DC power sources 20 and 21 and DC power sources 50 and 51 can be replaced with a radio frequency power source or a pulse power source.

Figure 12:
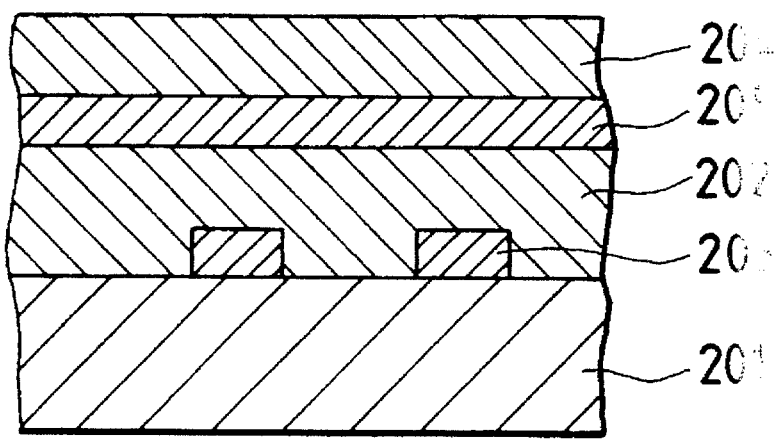
FIG. 12 is a cross sectional view illustrating an embodiment of a semiconductor device using a laminate thin film formed by the method of forming a thin film according to the present invention as a wiring film.

FIG. 12 is a cross sectional view illustrating one embodiment of a semiconductor device formed by the method described above. There are disposed a substrate 201, a first insulation film 202, a wiring film 203 for the first level, a second insulation film 204, a wiring film 205 for the second level.

Figure 13:
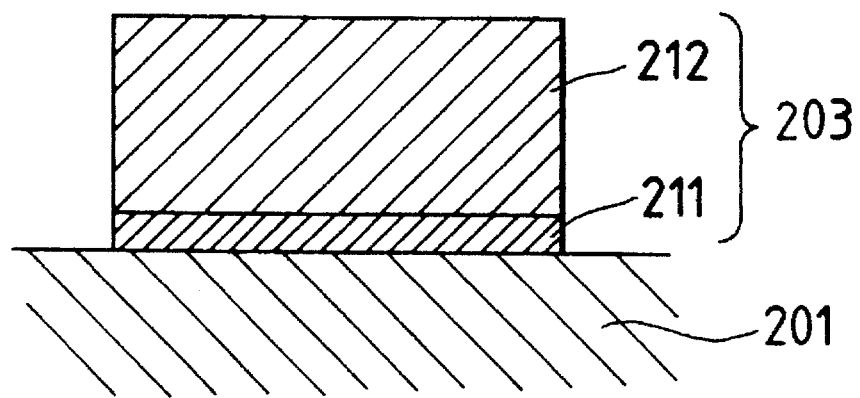
FIG. 13 is an enlarged view for a portion 203 shown in FIG. 12.

FIG. 13 shows an enlarged view for the cross section of the first level wiring 203 and the second level wiring 205, in which are shown an underlying film 211 for the wiring and the main wiring film 212. A wiring film of long life and high reliability can be attained by using a thin film made of a refractory metal comprising an alloy of W and Ti with low resistivity and less stress formed by the method as described above as the underlying film 211 for the wiring and using a film made of a low-melting-point metal comprising the Al alloy with a large crystal grain size formed by the method described above as the main wiring film 212.

Descriptions have been made to the above-mentioned embodiment for a case of using the alloy of W and Ti (10 wt %) as the material for the first target made of the refractory metal mainly composed of W, but material comprising only W may be used. Further, descriptions have been made to the case of using the alloy of Al, Cu (0.5 wt %) and Si (1.5 wt %) as the second target made of the conductive material mainly composed of the low-melting-point metal, it may be an alloy of Al and Si or Al and Cu, or a metal such as Al, Cu, Au, Ag or Pt, or an alloy comprising one of them as the main alloying element.

In FIG. 13, although an embodiment of a semiconductor device according to the present invention is illustrated as the wiring film of the two layer structure comprising the underlying film 211 for the wiring made of refractory metal and the main wiring film 212 made of the low-melting-point metal, a wiring film of higher reliability can be obtained by forming a refractory metal film on the main wiring film 212 to form a three-layered structure.

Further, according to the second feature of the present invention, it can provide an advantageous effect capable of forming a laminate film with low resistivity and less stress by laminating a thin film of a refractory metal of low resistivity and less stress and a conductive thin film comprising a low-melting-point metal of large crystal grain size.

Further, by using the laminate film according to the second invention in the semiconductor device, there can be also provided an advantageous effect capable of obtaining a wiring film of long-life and high reliability.

What is claimed is:

1. A method of forming a thin film, made of a refractory metal including at least Ti or W, by a bias sputtering method, using a target comprised of the refractory metal, comprising the steps of:

introducing a sputtering gas into a film-forming chamber;

positioning a substrate, on which the thin film is to be formed, in the film-forming chamber;

forming a magnetic field between said target and said substrate in the film-forming chamber;

producing and confining a plasma in said magnetic field; and sputtering said target and depositing said thin film on said substrate, while producing and confining the plasma, the target and the substrate being held at a distance TS from each other, and the sputtering gas being held at a sputtering gas pressure P, during said sputtering and depositing, the sputtering and depositing being performed while applying a substrate bias voltage V to said substrate, wherein a relationship, during film formation, for the sputtering gas pressure P, the distance TS between the target and the substrate and the substrate bias voltage V is as shown below:

$$1 \leq 1.3 \times 10^5 \cdot P \cdot TS/V^2 \leq 5 \ (Pa \cdot m \cdot V^{-2}),$$

wherein P is greater than 3 Pa, TS is greater than 60 mm and V is between −75 V and −150 V, whereby a thin film with a resistivity of less than 40 μΩ·cm and a stress of less than 1 GPa is formed.

2. A method of forming a thin film as defined in claim 1, wherein the target is made of tungsten or of an alloy of tungsten and titanium.

3. A method of forming a thin film as defined in claim 2, wherein the target is made of the alloy of tungsten and titanium, the alloy including 10 weight % titanium.

4. A method of forming a laminate of thin films, by a bias sputtering method, using a first target including a refractory metal and a second target including a second metal, comprising the steps of:

introducing a sputtering gas into a first film-forming chamber;

positioning a substrate, on which a first thin film is to be formed, in the first film-forming chamber;

forming a first magnetic field between said first target and said substrate in the first film-forming chamber;

producing and confining a first plasma in said first magnetic field;

sputtering said first target and depositing a first thin film, while producing and confining the first plasma in the first magnetic field, the first target and the substrate being held at a first distance greater than 60 mm from each other, and the sputtering gas being held at a first pressure greater than 3 Pa, during the sputtering the first target and depositing the first thin film, the sputtering and depositing being performed while applying a first bias voltage to the substrate, said first bias voltage being of a value, between −75 V and −150 V; wherein a relationship, during film formation in depositing the first thin film, for the sputtering gas pressure P, the distance TS between the first target and the substrate, and the substrate bias voltage V is as shown below:

$$1 \leq 1.3 \times 10^5 \cdot P \cdot TS/V^2 \leq 5 \ (Pa \cdot m \cdot V^{-2}),$$

whereby a first thin film with resistivity of less than 40 μΩ·cm and a stress of less than 1 GPa is formed;

transferring the substrate from the first film-forming chamber to a second film-forming chamber, with the substrate maintained in a vacuum such that the surface of the first thin film is kept clean;

introducing the sputtering gas into the second film-forming chamber to a second pressure;

positioning said substrate having the first thin film thereon in the second film-forming chamber at a second distance from the second target;

forming a second magnetic field between said second target and the substrate having the first thin film thereon;

producing and confining a second plasma in the second magnetic field; and sputtering said second target and depositing a second thin film on the first thin film, while producing and confining said second plasma in the second magnetic field, the second target and the substrate being held at the second distance from each other and the sputtering gas being held at the second pressure, during the sputtering the second target and depositing the second thin film, the sputtering the second target and depositing the second thin film being performed while applying a second bias voltage to the substrate, of a value between −40 V and −100 V so as to decrease energy of ions incident on the substrate and so as to accelerate ions to collide with the second thin film to grow said second thin film under promoted diffusion of atoms in a surface of said second thin film without damage to the second thin film, whereby the second thin film, having a large crystal grain size, is grown laminated on the first thin film.

5. A method of forming a laminate of thin films as defined in claim 4, wherein the material of the second target is selected from the group consisting of Al, Cu, Au, Ag, Pt and alloys thereof.

6. A method of forming a laminate of thin films as defined in claim 4, wherein the material of the first target includes an alloy of Ti and W, and the material of the second target is an alloy selected from the group consisting of (a) an alloy of Al, Cu and Si, (b) an alloy of Al and Si and (c) an alloy of Al and Cu.

7. A method of forming a laminate of thin films as defined in claim 4, wherein the substrate on which the first thin film has been formed is set in the second film-forming chamber which is maintained at a high vacuum of less than $1.0\times10^{-4}$ Pa over a period from depositing the first thin film to depositing in lamination the second thin film.

8. A method of forming a laminate of thin films as defined in claim 4, including the further step of forming a refractory metal film on the second thin film.

9. A method of forming a laminate of thin films as defined in claim 4, wherein the substrate is transferred from the first film-forming chamber to the second film-forming chamber while being maintained in a vacuum such that the surface of the first thin film is kept free of oxide.

* * * * *